United States Patent [19]

Janisiewicz et al.

[11] Patent Number: 4,500,246
[45] Date of Patent: Feb. 19, 1985

[54] INDEXED FEED OF ELECTRONIC COMPONENT SUPPLY TUBES

[75] Inventors: Stanley W. Janisiewicz, Endwell; Maynard J. Hills, Owego; Edward J. Lovell, Binghamton, all of N.Y.

[73] Assignee: Universal Instruments Corporation, Binghamton, N.Y.

[21] Appl. No.: 471,056

[22] Filed: Mar. 1, 1983

[51] Int. Cl.³ .............................................. H05K 3/30
[52] U.S. Cl. ...................................... 414/414; 221/11; 414/403
[58] Field of Search ................... 414/403, 414; 221/11, 221/106, 126, 127

[56] References Cited

U.S. PATENT DOCUMENTS 3,704,810 12/1972 Sakai .................................. 221/11 X
4,401,234 8/1983 Droira et al. ................... 221/106 X Primary Examiner—Robert G. Sheridan
Attorney, Agent, or Firm—Fidelman, Wolffe & Waldron

[57] ABSTRACT

Constant supply of electronic components to a processing station is effected by a reservoir and component supply tubes indexed to sequentially unload into the reservoir automatically, as the need arises. Plural component supply tubes are mounted in a cartridge assembly at each station of a multistation processing machine. Upon command of a controller and in response to a low part sensor of a reservoir at each station, the cartridge is indexed to the next tube in order to unload the components of that tube into the reservoir. Each station includes a separate indexing mechanism for each respective cartridge, and a carriage is translated to a position adjacent the indexing mechanism of each station, upon command, in order to effect such indexing.

9 Claims, 25 Drawing Figures

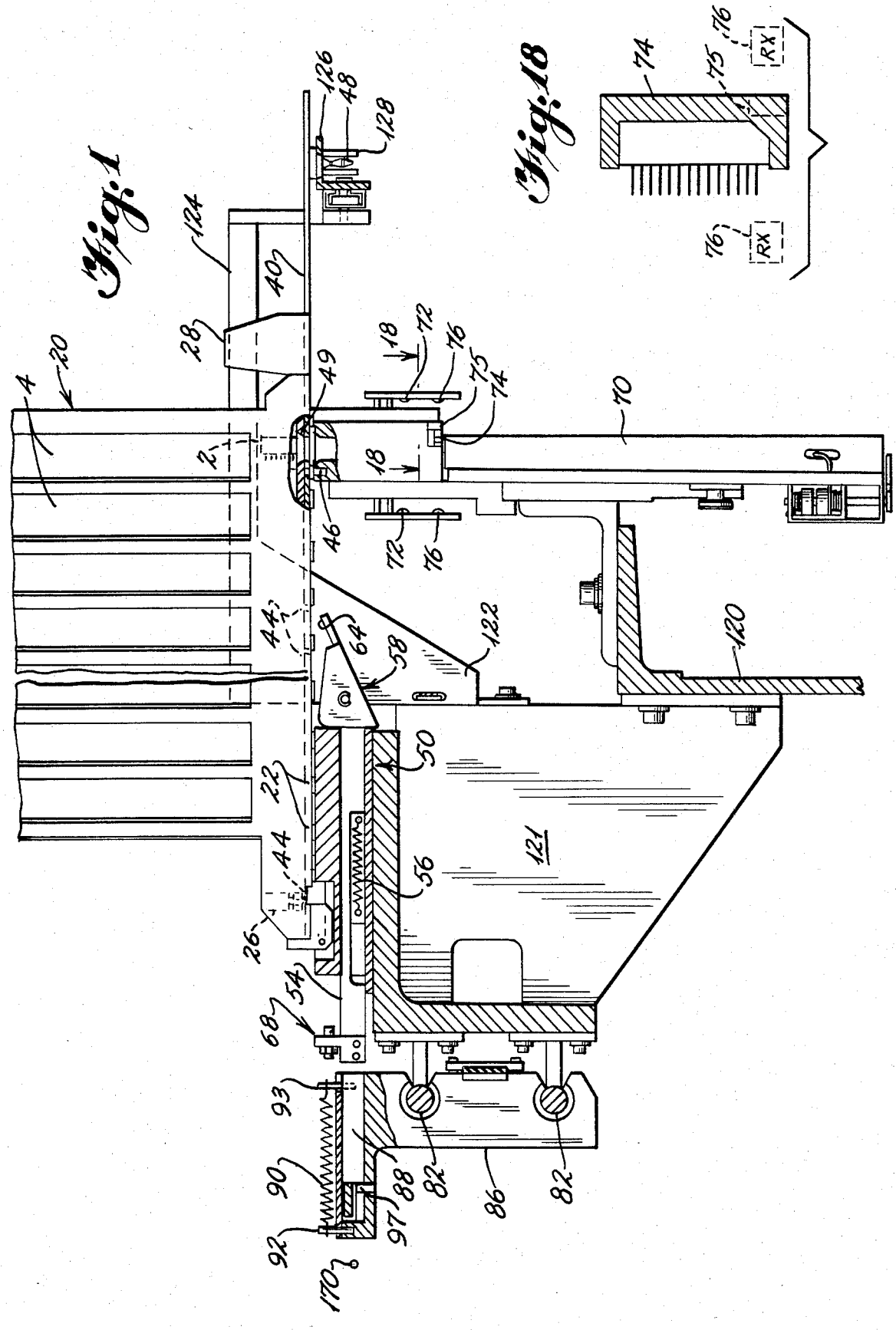

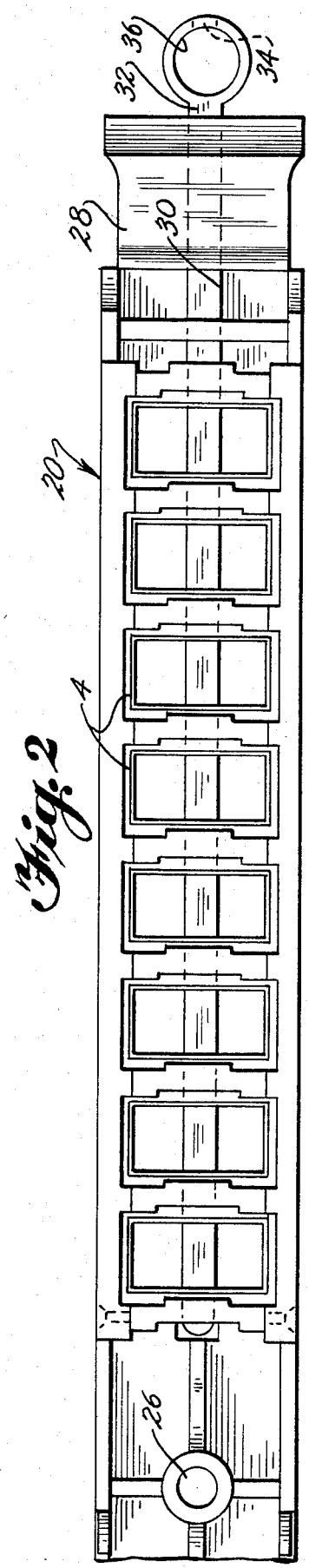
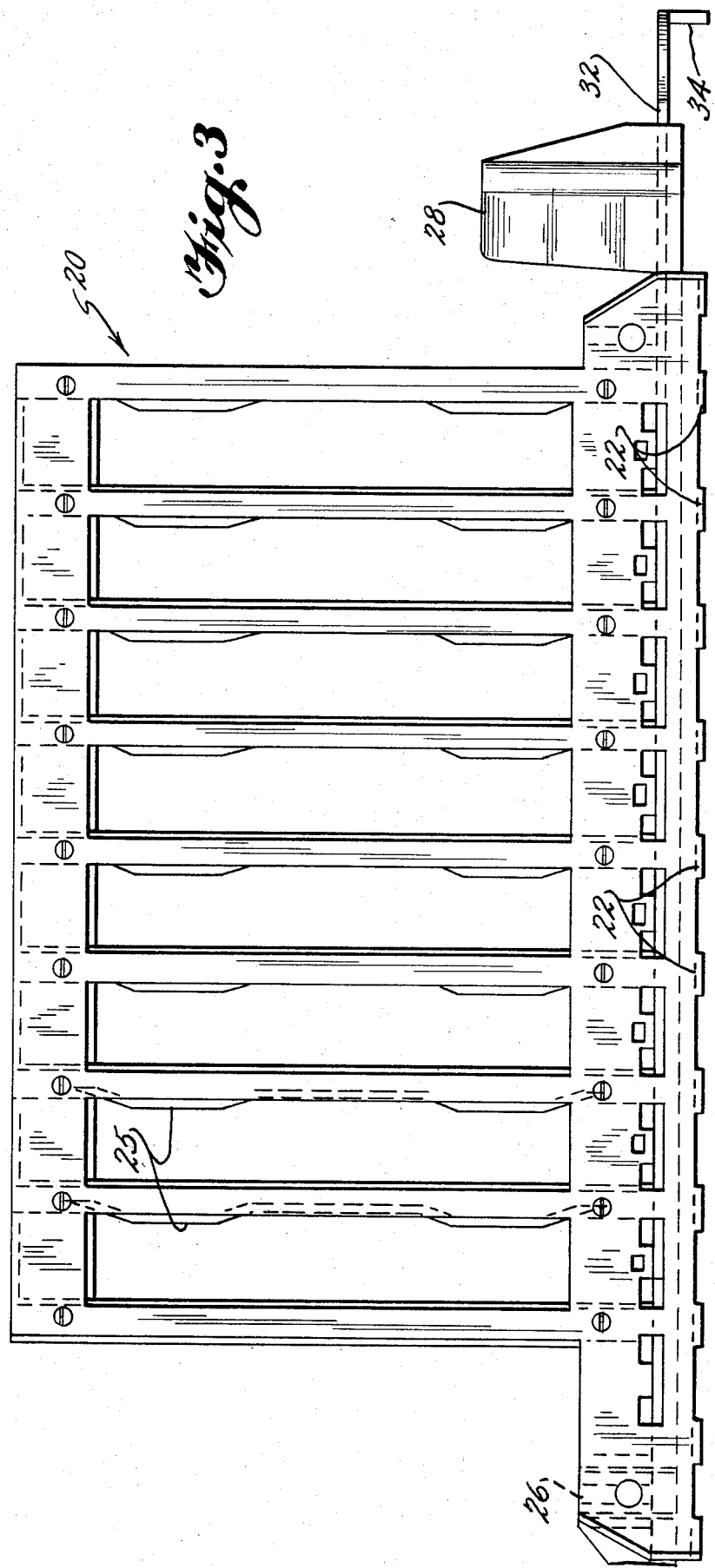

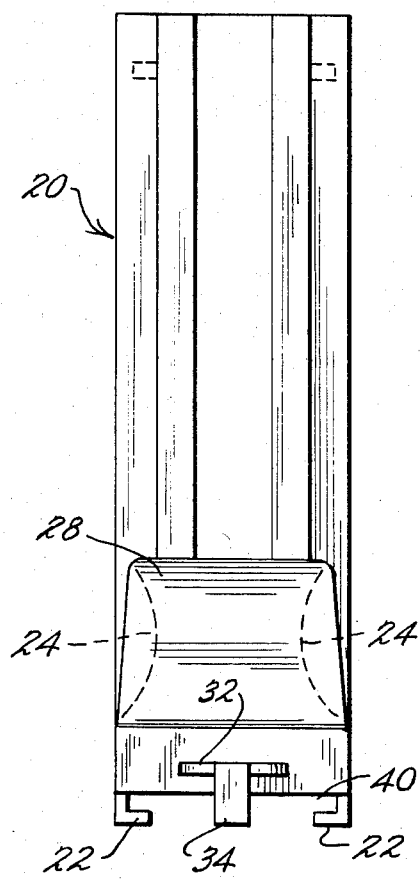
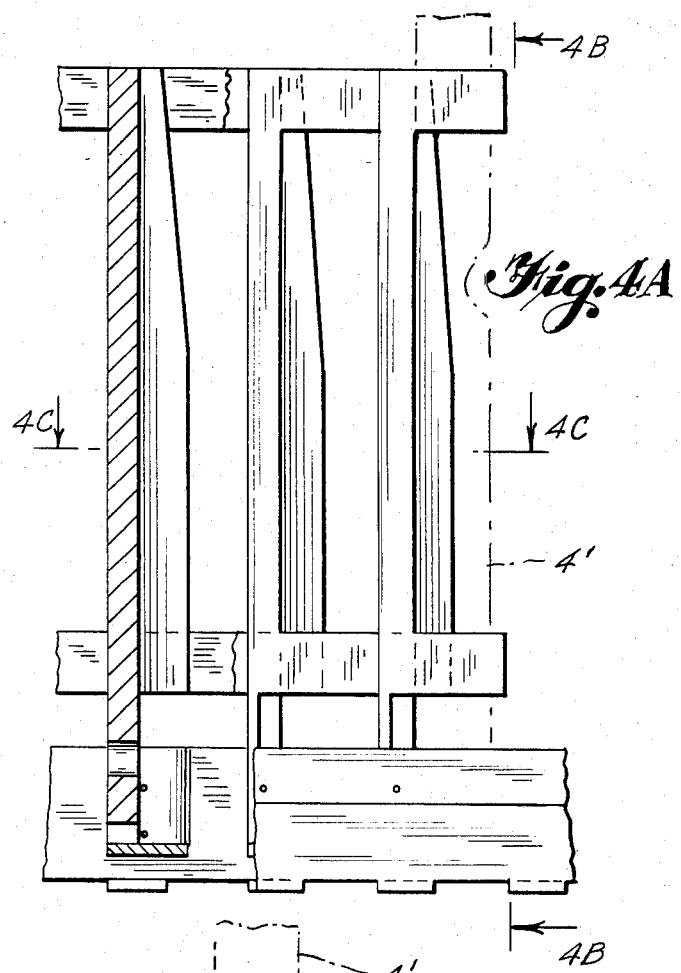
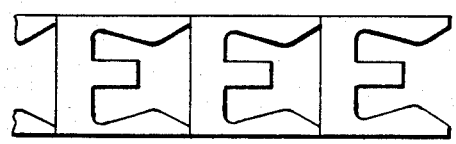
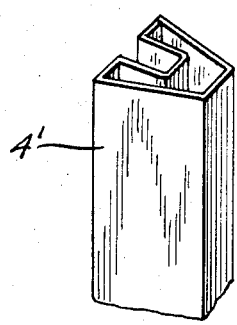

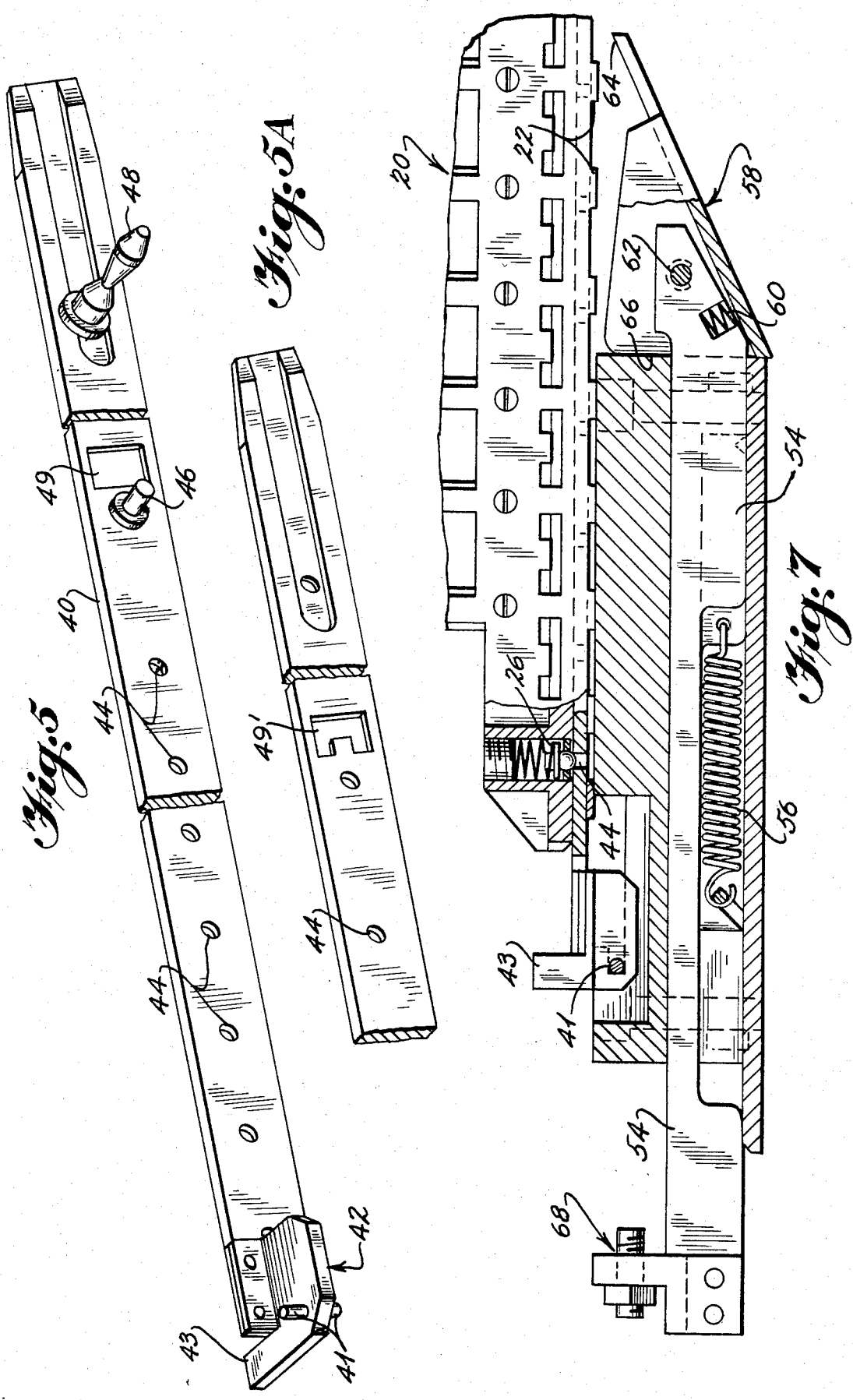

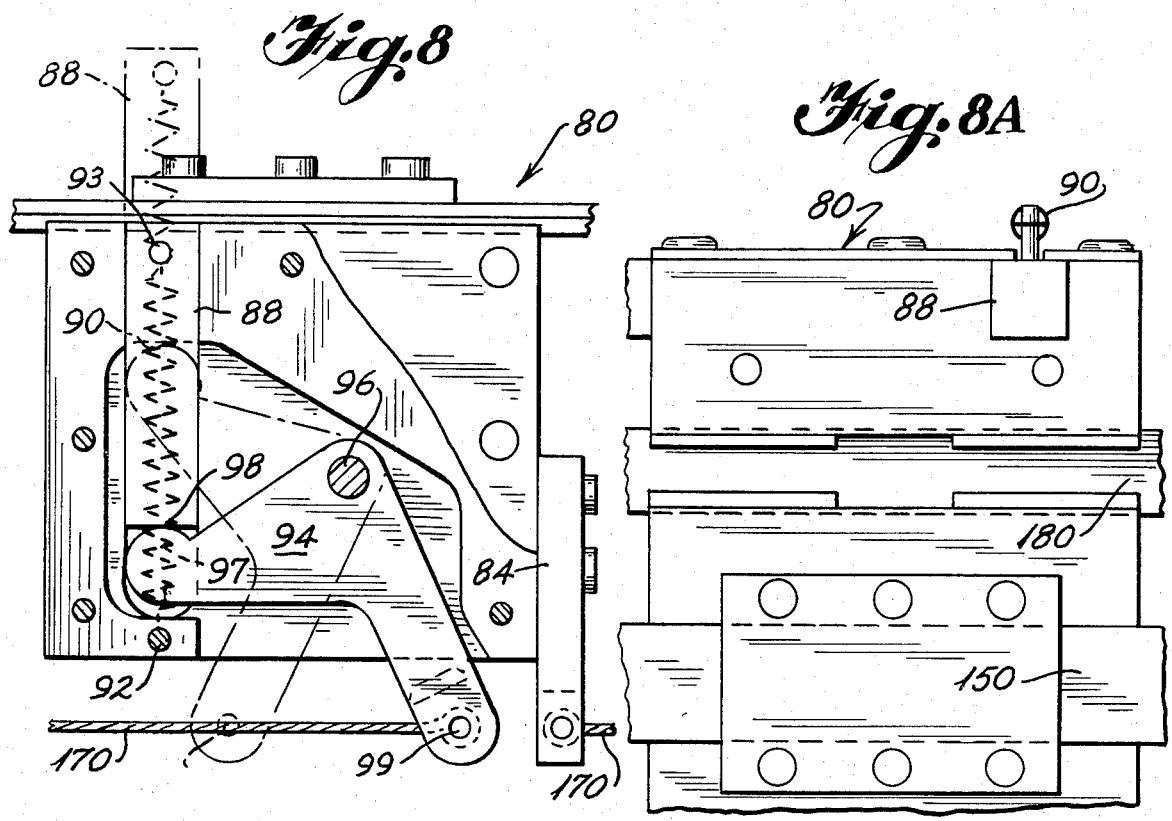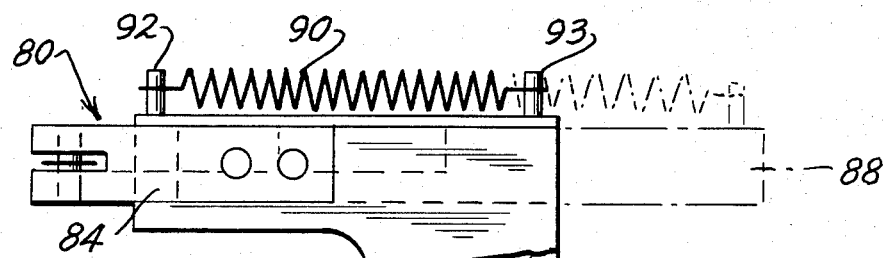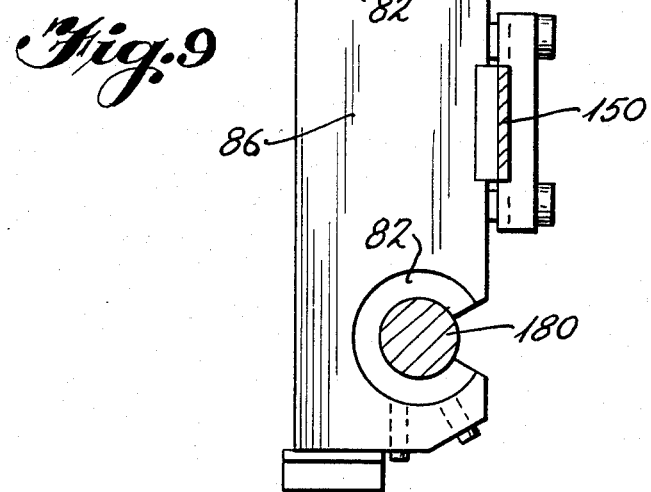

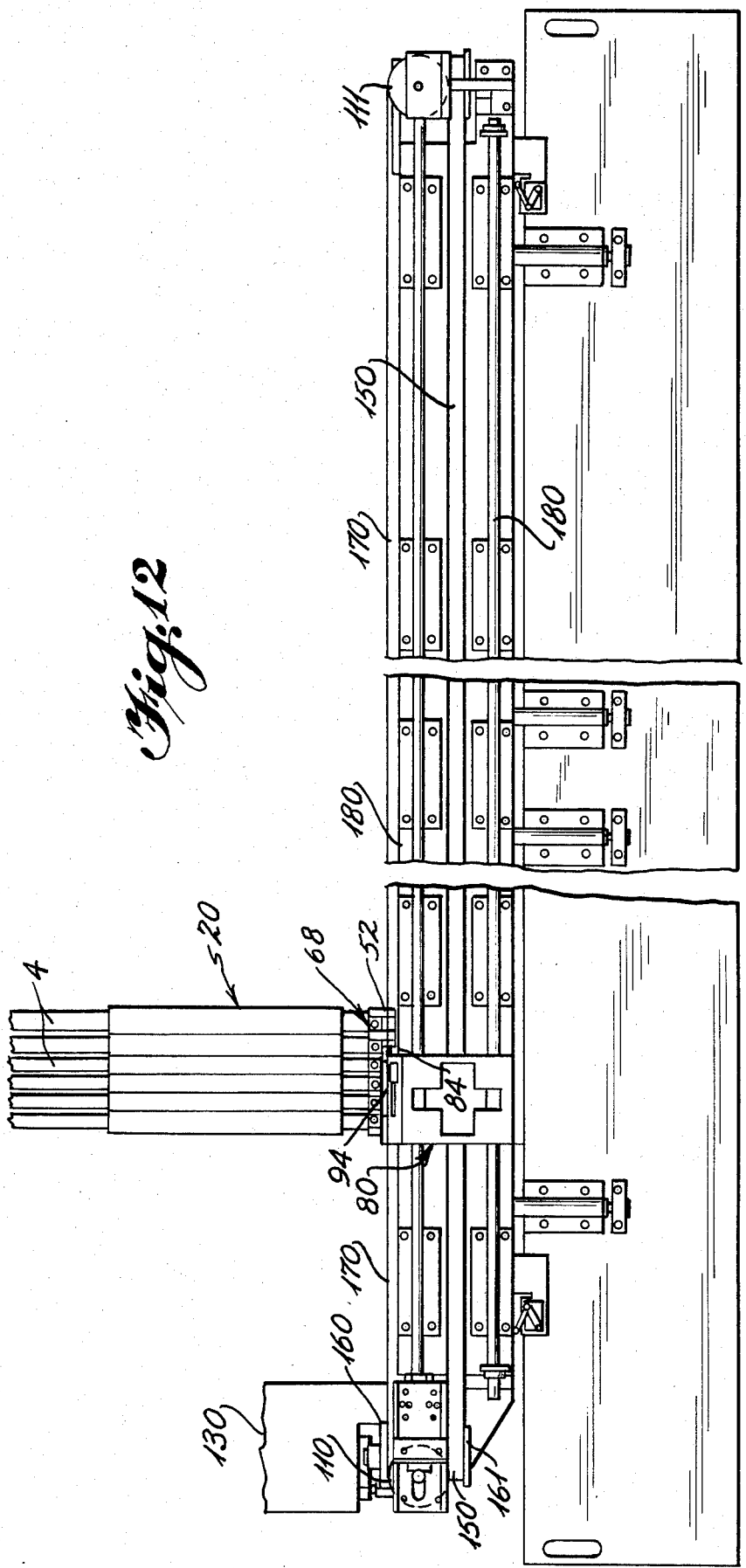

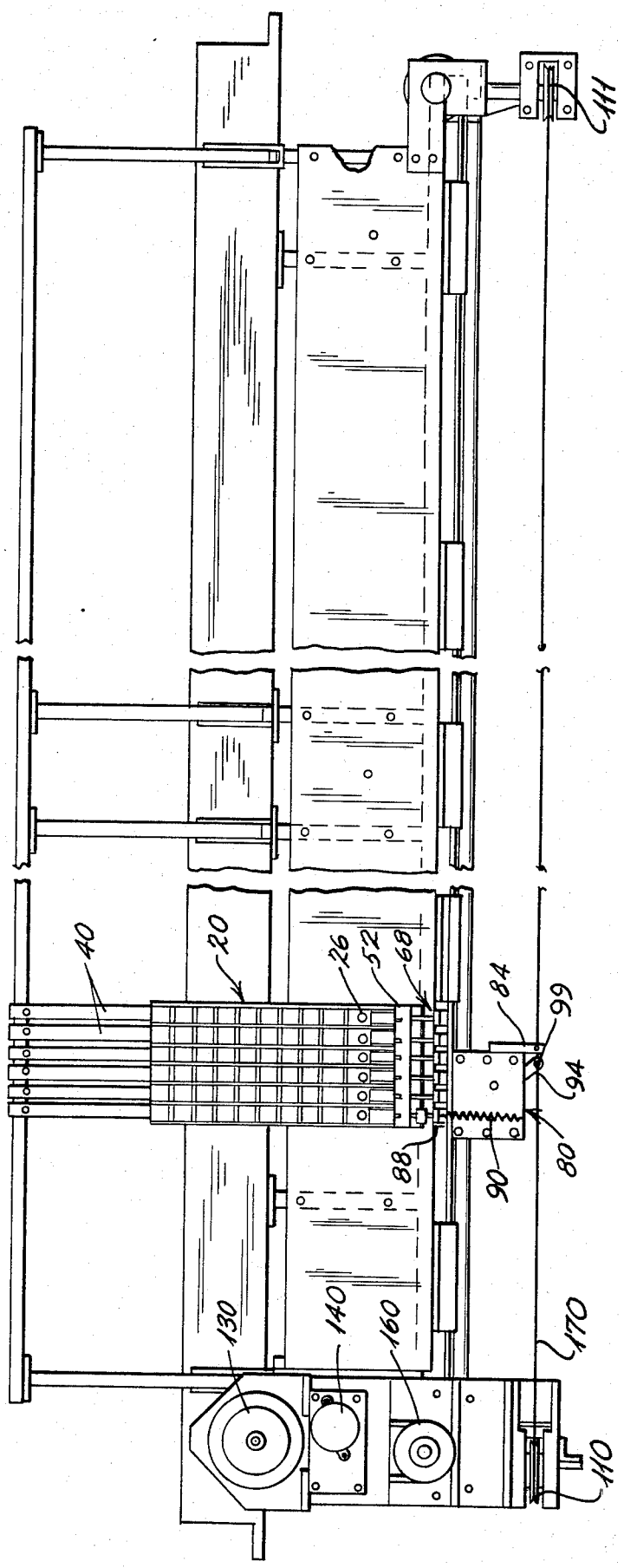

INDEXED FEED OF ELECTRONIC COMPONENT SUPPLY TUBES

CROSS-REFERENCES TO THE PRIOR ART

Japanese patent application No. 107130/1978—AUTOMATIC INSERTION DEVICE FOR ELECTRICAL PART Japanese patent application No. 10445/1981—PART FEEDER

BACKGROUND AND SUMMARY OF THE INVENTION

The invention is in the field of automated processing of components, particularly electronic components. In the automated processing of electronic components, a need exists for a method and apparatus of supplying integrated circuit-type electronic components to one or more processing stations in a fast, efficient, and interchangeable manner, while minimizing the number of operators that are necessary to keep such an automated processing machine in operation. U.S. Pat. No. 4,327,483—Zemek, et al. discloses a typical component processing machine of the prior art, in which a single vertical supply tube is located at each of a plurality of supply stations on the front of the machine. Components are selectively transported from each station to an insert head for population of a circuit board. The apparatus of the instant invention is particularly adaptable to machines of this general nature such that, upon depletion of the components from a supply tube at a particular station, a full supply tube is automatically indexed forward to replace the depleted tube.

Prior art methods and apparatus for performing automatic exchange of empty supply tubes with full supply tubes is disclosed or inferred in the above-referenced Japanese patent applications. In both of these prior art devices, the longitudinal axes of the supply tubes or "sticks" are oriented horizontally. In Japanese patent application No. 10445/1981, horizontally oriented supply tubes are secured in a turret which is rotatable to present a selected magazine to a station for removal of the component therefrom. Such a turret arrangement could be used at each of a plurality of stations in order to provide a continuous supply of tubes to the station. Since the manner of advancing the components of a tube to the particular station is not disclosed, it is also contemplatable that the device may be oriented such that the sticks have a vertical orientation. In either event, horizontal or vertical orientation of the supply tubes, the stations may not be any closer together than the diameter of the turret mechanism, an important point when considering the fact that such a machine often may be handling as many as 70 different types of components.

Japanese patent application No. 107130/1978 discloses a plurality of horizontally oriented supply tubes, stacked one upon the other, with air pressure against a line of components acting as a feed means for emptying the bottommost supply tube. Upon emptying the bottommost supply tube, the tube is ejected from the stack in order that the next tube is available to supply components to the processing station. Horizontally oriented supply tubes have several disadvantages. Plugs are often inserted in the ends of the tubes to retain components therein, prior to unloading them, with the holes or edges for receiving these plugs having burrs that will cause horizontally fed components to be hung-up on the burrs. Additionally, it is often the case that a supply tube will be slightly warped along its longitudinal axis so that discharge of a warped tube from the stack is difficult to effect. Further, since both ends of the supply tube must be open to effect the horizontal feeding of the components from each supply tube, it is difficult to exchange or replace any of the stacked tubes without loss of components. In both of the above-referenced Japanese patent applications, the length of the supply tubes is limited by the apparatus in which they are held.

By the instant invention, there is no limit to the length of the supply tubes and, due to the gravity feed of the components, there is no such problem with burrs or warping of the tubes. Further, with the instant invention, one end of the supply tubes may be left closed in order that an easy exchange of supply tubes may be effected without loss of components.

A preferred embodiment of the invention comprises a plurality of vertically stacked components, one behind the other, at each station of a component processing machine such as the type generally illustrated in U.S. Pat. No. 4,327,483—Zemek, et al. Once loaded, a cartridge of the plural stacks of components is indexable toward the front of the machine to present a new supply stack to an unload station automatically, as the need arises. Each station has a corresponding indexing pusher assembly which is selectively addressable by a carriage having a means for actuating the selected pusher assembly. The cartridge containing these vertical stacks of components may be loaded and unloaded from the front of the machine such that an operator does not have to be stationed in back of the machine, or run around to the back of the machine, in order to load or unload such a cartridge. Rather, all loading and unloading may be accomplished at the front of the machine so that only one operator may handle such functions. Further, when the conventional component supply tubes or "sticks" are supported in a cartridge, the empty supply tubes are retained in the cartridge until the cartridge is removed from the machine and, thus, a complete package comprising a cartridge and a plurality of supply tubes is provided at each station for ease of handling.

Accordingly, the invention comprises a method having several steps and the relation of one or more of such steps to each of the others, and the apparatus embodying features of construction, combination of elements, and arrangements of parts which are adapted to effect such steps, all as exemplified in the following detailed disclosure. The scope of the invention will be indicated in the claims.

For a fuller understanding of the nature and objects of the invention, reference should be had to the following detailed description taken in conjunction with the accompanying drawings, in which similar reference characters refer to similar parts throughout the several views of the drawings.

BRIEF DESCRIPTION OF THE DRAWINGS

FIG. 1 is a side view, partially in section, illustrating the manner in which the device is mounted upon the main frame of an automated component processing machine.

FIGS. 2-4, respectively, are top, side, and front elevations of the cartridge assembly of the instant invention.

FIG. 4A-4C illustrate an alternate cartridge assembly.

FIG. 5 is an isometric of the blade assembly of the instant invention.

FIG. 5A illustrates an alternate blade assembly.

FIG. 7 is a cross-sectional view of the pusher assembly, as viewed generally along arrows 7—7 of FIG. 6, with portions thereof partially in section.

FIGS. 8 and 9, respectively, are top and left side elevations, partially in section, of the carriage assembly of the instant invention.

FIG. 8A is a bottom elevation of the device of FIG. 8.

FIGS. 12 and 13, respectively, are rear and top elevational views of the instant invention.

FIG. 18 is a cross-section as viewed generally in the direction of arrows 18—18 of FIG. 1.

FIG. 19 illustrates a DIP tube.

DETAILED DESCRIPTION OF THE INVENTION

Figure 6:
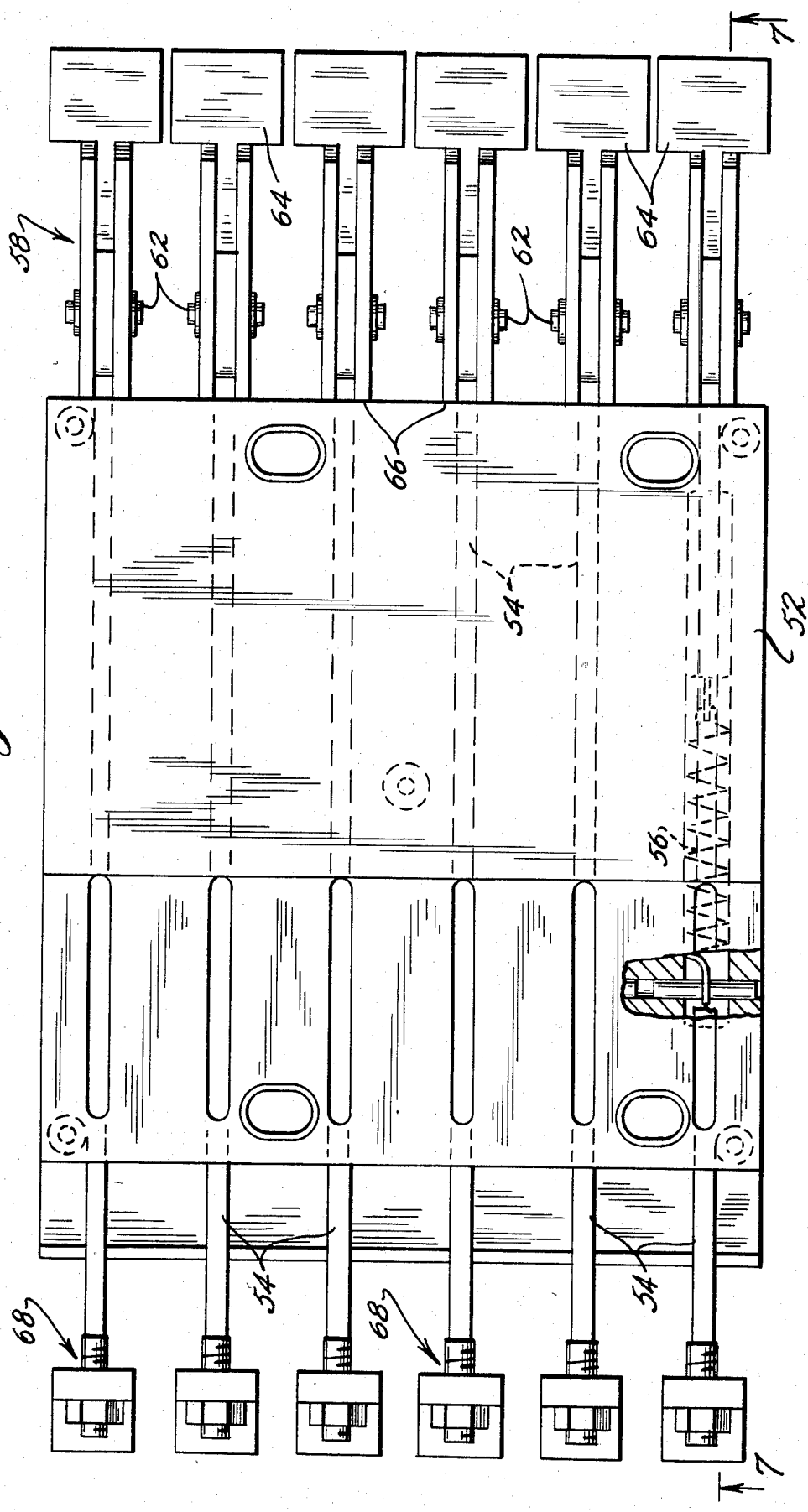
FIG. 6 is a top plan view, partially in section, of a pusher assembly.

Referring to FIG. 1, the main frame 120 of an automated component processing machine has a magazine or reservoir assembly 70 attached to the front (left) thereof, for each station of the machine, with a bracket 121 attached to the rear (right) thereof for support of a pusher assembly 50. Bracket 122 is attached to bracket 121 and has forward extending arm 124 to which angle iron 126 is attached at the front of the machine. Angle arm 126 has a spring clip 128 attached thereto for receiving pin 48 of a blade assembly 40 (as best seen in FIG. 5) in a snap-fit relation. Referring to FIGS. 1 and 5-7, it may be seen that pusher housing 52 is mounted upon bracket 121 and receives slip-hinge portion 42 of blade assembly 40 for rear support thereof, while the front support of blade assembly 40 is provided by angle arm 126. Locater pin 46 of blade assembly 40 is registered with an opening in the body of the reservoir assembly 70 (as best seen in FIG. 1), in order to properly align the reservoir assembly 70 with unload hole 49 and indexing holes 44 of blade assembly 40.

Referring to FIGS. 1-4, a cartridge assembly 20 telescopes onto blade assembly 40 by wrap-around portions 22, so that cartridge 20 is supported by blade assembly 40. Cartridge 20 is adapted to receive plural component "sticks" or tubes 4 in a generally vertical orientation, with leaf springs 25 located in each compartment of cartridge 20 for engaging and holding component tubes 4 in their proper orientation. Cartridge 20 has a spring-biased detent mechanism 26 (FIG. 7) for registering with the various indexing holes 44 of blade assembly 40 to provide "exact" indexing, as will become apparent from the description of the operation of the device. A handle 28 on the front of cartridge 20 is provided with depressions 24 for ease of grasping between the thumb and fingers of an operator. Telescopically received within a slot 30 in the body of cartridge 20 is a blocking rod 32 having a finger loop portion 36 and a front stop portion 34. Wraparound portions 22 also act as "rough"-indexing fingers, as will become apparent from the description of the operation of the device.

Referring again to FIGS. 1 and 5-7, pusher assembly 50 is provided with plural pusher rods 54, one for each station, which are reciprocatable within housing 52. A tension spring 56 maintains each pusher rod 54 in the rear position (the retracted, left position as seen in FIG. 1) and, upon actuation, pusher rod 54 is extended against the return biasing of spring 56. Upon such extension, pivotal arm 58 is urged in a counterclockwise direction about pivot pin 62 by compression spring 60 (as best seen in FIG. 7) so that engager portion 64 may engage wraparound, "rough"-indexing portions 22 of cartridge 20 in order to effect indexing of cartridge 20 (to the right as viewed in FIG. 1). During retraction of pusher blade 54 by return spring 56, cam portion 66 of pivotal arm 58 engages housing portion 52 to effect clockwise rotation of pivotal arm 58 and clearing of engager portion 64 from portions 22 of cartridge assembly 20. A threaded rod and nut arrangement 68 is provided at the rear of pusher rod 54 in order that the length of the forward stroke of the pusher arm 54 is adjustable by engagement of threaded rod 68 with housing 52.

Figure 14:
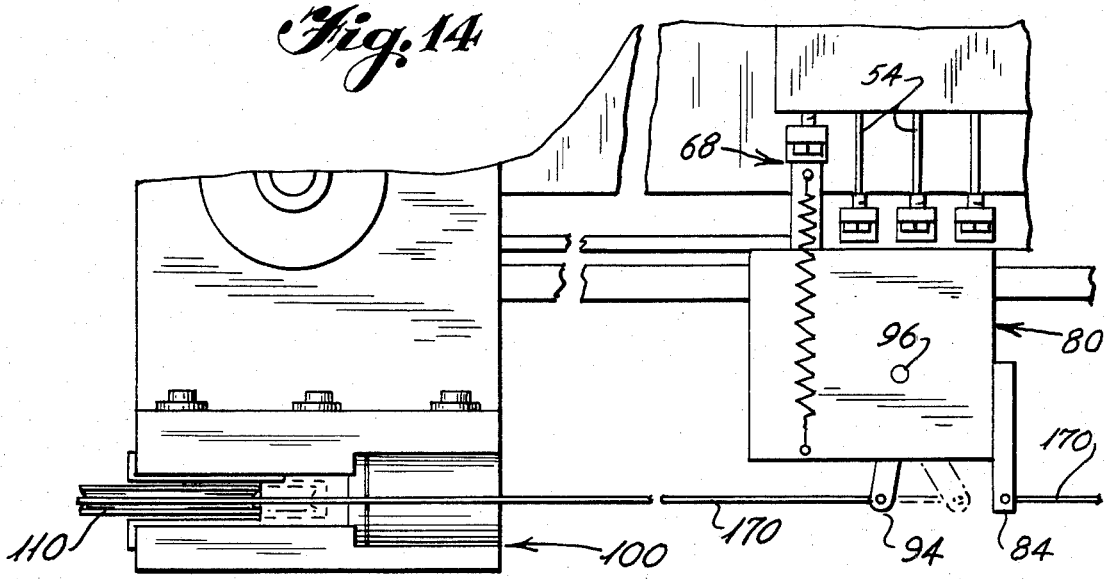
FIGS. 14-16 are partial views illustrating operation of the carriage and pusher assemblies.
Figure 15:
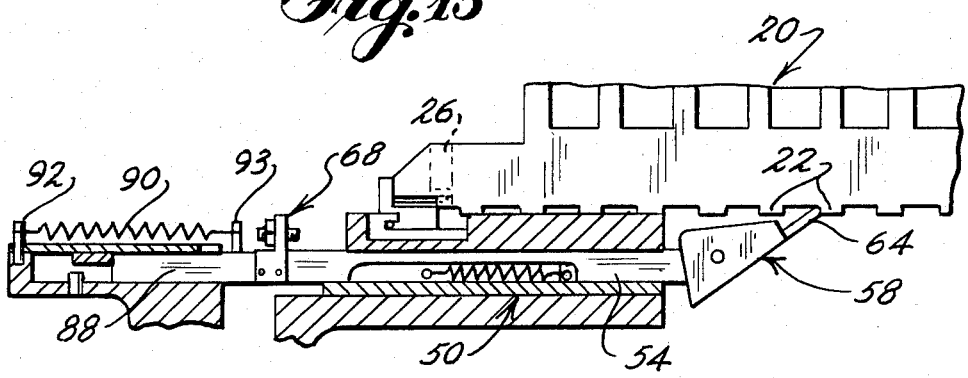
Figure 16:
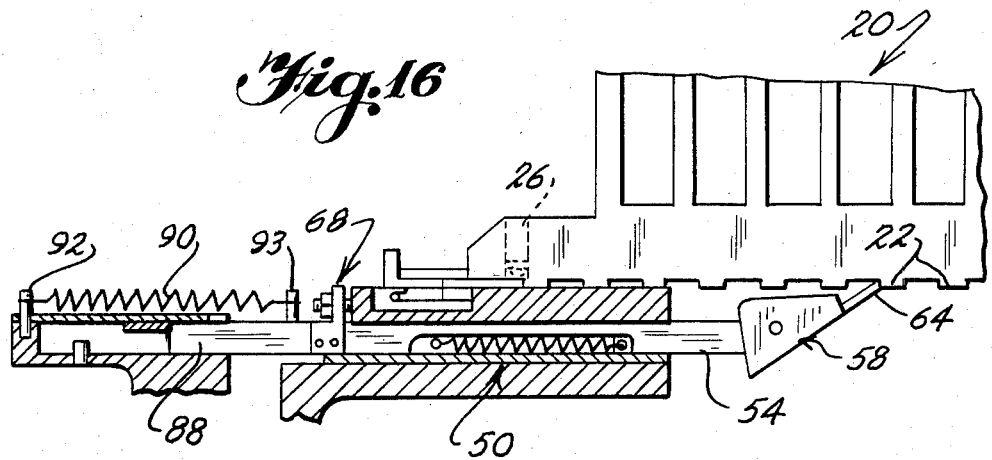

In order to actuate forward stroking of a particular pusher rod 54, a carriage assembly 80 (FIGS. 8, 8A, and 9) has been provided with a reciprocating rod 88 which is engageable with the rear portion of pusher rod 54 (as seen in FIGS. 14-16). The main body 86 of carriage assembly 80 is supported for transfer to various pusher rods 54 on Thompson rods 180 by timing belt 150 (best seen in FIGS. 12 and 13), with bearings 82 of main body portion 86 adapted to receive Thompson rods 180. Thompson rods 180 are appropriately attached to the rear portion of bracket 121. Main body 86 of carriage assembly 80 further comprises an angle lever 94 pivotal about pin 96 and engageable at 98 with reciprocating rod 88. Reciprocating rod 88 is biased to the retracted position by tension spring 90 which is connected at one end to reciprocating rod 88 by pin 93, and at the other end to main body 86 by pin 92. The limit of retraction of reciprocating rod 88 is defined by stop pin 97. A bracket 84 is attached to main body portion 86 of carriage assembly 80 to receive one end of a cable 170, with the other end of cable 170 attached to the free end of pivotal, angled lever 94. In this manner, angled lever 94 may be pivoted clockwise about pin 96 by pulling on that portion of cable 170 which is attached at attachment point 99 (i.e., pulling to the left on cable 170 as viewed in FIG. 8). As may be seen by further reference to FIGS. 12 and 13, cable 170 is wrapped around fixed pulley 111 (to the right in FIGS. 12 and 13) and around movable pulley 110 (to the left in FIGS. 12 and 13), and actuation of pivotal lever 94 is effected by extending pulley 110 to the left as viewed in FIGS. 12 and 13.

Figure 10:
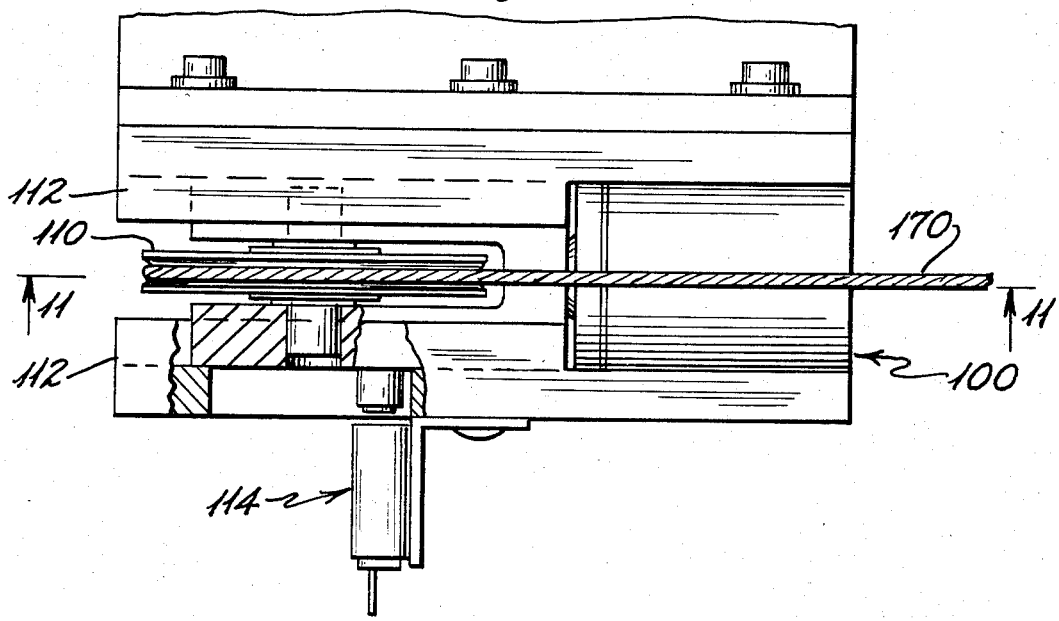
FIGS. 10 and 11, respectively, are rear and top elevations, partially in section, of the carriage actuator assembly.
Figure 11:
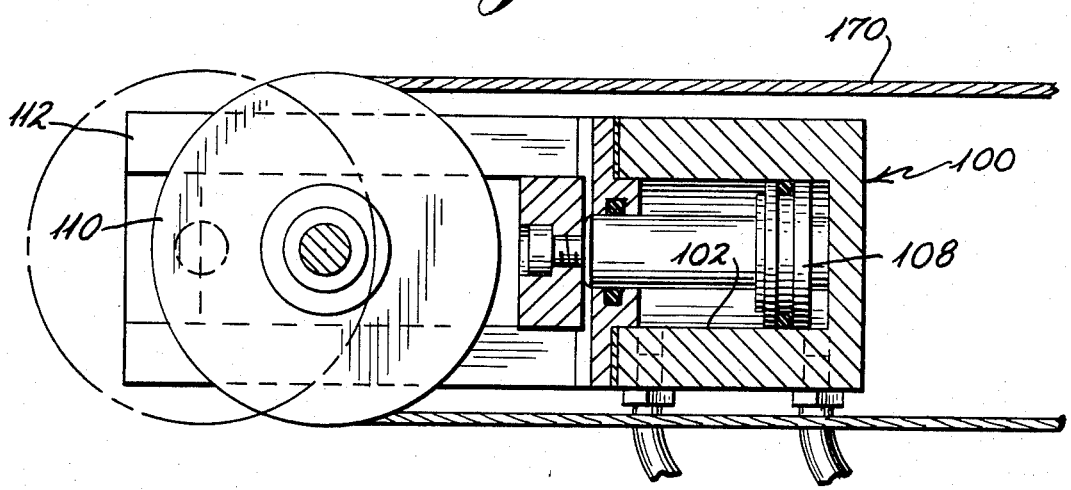

FIGS. 10 and 11 illustrate the structure of extensible pulley 110. As may be seen by reference to these drawings, pulley 110 is supported for left or right movement by a piston rod and bracket arrangement, and is actuated for such movement by cylinder 102 and piston 108, in a well-known manner and according to a controller. Piston housing 100 has a Hall effect switch 104 attached thereto to sense the retracted position of pulley 110. As also may be seen from FIGS. 12 and 13, a timing belt 150 is provided for transport of carriage assembly 80 to the proper pusher bar location in accordance with a controller. Timing belt 150 is attached, via pulleys 160 and 161, to an encoder 140 and servo motor 130.

OPERATION OF A PREFERRED EMBODIMENT OF THE INVENTION

With a cartridge 20 for each pusher rod 54, i.e., six cartridges for the pusher assembly illustrated in FIG. 6; and with plural side-by-side pusher assemblies 50 mounted on or adjacent to a component processing machine, a large volume of components is available by indexed supply of tubes to each station (each reservoir). Since cartridge 20 holds a plurality of component "sticks" or tubes 4, i.e., eight supply tubes 4 for the cartridge of FIGS. 2 and 3, reservoir 70 always has an ample supply of components therein such that each processing station may continue to run during sequential indexing of tubes 4 to the front of the machine for unloading the components thereof into reservoir 70. Additionally, the amount of components held in reservoir 70 is sufficient that, having emptied all of the supply tubes 4 of a particular cartridge 20, a filled cartridge 20 may be replaced at each station while the processing machine continues to run.

To effect sequential indexing of component supply tubes 4 forwardly (to the right as viewed in FIG. 1), as needed, a low part sensor 72 is mounted to magazine 70 for sensing that an insufficient stack of components is in reservoir 70 and, hence, that a supply tube 4 which is above magazine 70 is empty. This sensor 72 then notifies the controller (not shown) so that servo 130, encoder 140, timing belt 150, and the mechanisms associated therewith may transport carriage assembly 80 to the proper processing station, such that pulley 110 may be extended to actuate reciprocating rod 88 which, in turn, actuates the pusher bar 54 of pusher assembly 50. Actuation of pusher assembly 50 allows engager portion 64 to engage and advance "rough" indexing portions 22 of cartridge 20 (as seen in FIGS. 14-16). "Exact" indexing of each successive supply tube 4 relative to unload hole 49 of guide blade 40 is effected by engagement of spring detent mechanism 26 of carriage 20 with indexing holes 44 during such indexing.

When it is necessary to exchange cartridge 20 at a particular station, such exchange may be effected in one of two different methods. The first method comprises lifting the front of guide blade 40 to disengage pin 48 from spring clip 128, while pivoting blade 40 (and the attached cartridge 20) about pivot pin 41 which is still engaged in a slot of pusher assembly housing 52. Thereafter, blade 40 is pulled forward to disengage pivot pin 41 from the slot of pusher assembly housing 52 thus allowing blade 40 and cartridge 20 to be removed from the particular station needing resupply. The alternative method of resupplying such a station is to leave blade assembly 40 attached to the machine while grasping cartridge 20 by finger hold 28 and sliding cartridge 20 along and off of blade 40 at the front of the machine. Thereafter, reverse steps are performed to reload a new blade 40 and cartridge 20 onto pusher assembly 50, or a new cartridge 20 onto the old remaining blade 40, as the situation dictates. The provision of pin 46 on guide blade 40 ensures proper indexing relationship between the various indexing holes 44 of blade 40 and unload hole 49 relative to the top of reservoir 70. When reloading a particular cartridge 20 onto the corresponding guide blade 40, front stop 34 of blocking rod 32 engages with the front end of guide blade 40 such that, during sliding of cartridge 20 to the rear of the machine, successive supply tubes 40 are cleared by blocking rod 32 allowing the bottom component of a tube 4 to engage the top of guide blade 40. By referring to FIG. 1, it may be seen that the front few supply tubes 4 are still blocked by blocking rod 32, such that no components are supplied to reservoir 70 at the unload station. By inserting a finger into finger loop 36 of blocking rod 32, the operator is then able to fully retract blocking rod 32 and allow unloading of components 2 from the supply tube 4, located at the unload station, into reservoir 70.

Having indexed a full supply tube 4 to the unload station (directly above reservoir 70), a vertical stack of components will extend from the bottom of reservoir 70 through unload hole 49 and up into a supply tube 4. Accordingly, if it is desirous to exchange cartridge 20 without unloading any more components into reservoir 70, blocking rod 32 may be reinserted into slot 30 of cartridge 20 sufficiently to engage the bottom component of the tube which is located at the insert station and to slightly "jam" the component against the tube so that, upon tilting blade 40 as described earlier, the cartridge and blade may be removed and replaced as a unit.

Figure 17:
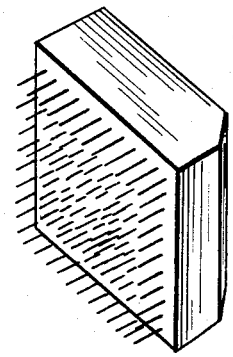
FIGS. 17 and 17A illustrate two different components which are processable by the apparatus of the invention.

Although the invention is not limited to processing of components having a particular physical structure, the embodiment described above is particularly adapted to those components generally referred to as "square modules", one of which is illustrated in FIG. 17. The body of square module 2 has a chamfer 3 in order to determine proper orientation of the component, and the apparatus of FIG. 1 has a device 74 for ensuring that only those square modules which are properly oriented may pass through magazine 70. Referring to FIG. 18, orientation block 74 is designed to slidingly receive component 2 with only one correct orientation. Block 74 also has a tab 75 for blocking photosensor 76 (FIG. 1) and indicating to the controller a particular orientation of components 2 for which the station has been set up. Block 74 may be removed, rotated, and reattached to the station so that another orientation of components 2 is receivable by magazine 70 and, in the rotated position, tab 75 does not interrupt photosensor 76 such that the controller senses this other orientation by a decision process.

Figure 17A:
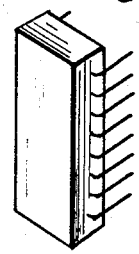

In an alternate embodiment, the machine has been adapted to handle "DIP"-type components 2' (FIG. 17A) which are furnished in supply tubes 4' (FIG. 19). Cartridge 20 has been modified to that of cartridge 20' (FIGS. 4A-4C) in
order to support tubes 4', and unload hole 49' (FIG. 5A) is specifically designed to pass components 2'.

It will thus be seen that the objects set forth above, among those made apparent from the preceding description, are efficiently attained and, since certain changes may be made in carrying out the above method and in the construction set forth without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention, which, as a matter of language, might be said to fall therebetween.

Now that the invention has been described, what is claimed as new and desired to be secured by Letters Patent is:

1. An automated apparatus for supplying electronic components to a processing station, said apparatus comprising:

cartridge means for supporting plural, generally in-line and generally vertical columns of said components and comprising a cartridge having plural removable tubes, said tubes each having at least one end open and defining said columns, said cartridge having an unload opening such that components of an unload column are dischargeable through said unload opening to a column unload station;

indexing and locating means for indexing said columns generally horizontally and locating each of said columns sequentially at a column unload station, said column located at said unload station being an unload column;

blade means for guiding and supporting said cartridge relative to said unload station such that said cartridge is slidable on said blade means for said column indexing, said blade means comprising a slip-hinge and snap-fit pin connection to a frame such that said cartridge, when slideably attached to said blade means, is positionable relative to said frame by said slip hinge by a sliding, pivoting motion and removably attached to said frame by said snap-fit pin upon seating of said hinge with said frame.

blocking means for selectively enabling and disabling discharge of said components from said columns, said blocking means telescopically receivable in said cartridge;

reservoir means for receiving components from said unload column and providing a reservoir of a sufficient number of said components for said processing station such that a continuous processing of said components at said processing station is attainable during a replacement of said columns; and controller means for controlling said indexing.

2. An apparatus as in claim 1, and further comprising:
blocking means for selectively enabling and disabling discharging of said components from said columns.

3. An apparatus as in claim 1, wherein:
said blade means further comprises indexing apertures;
said cartridge further comprises detent means for registration with said indexing apertures and for holding said columns in a particular index position; and
said apparatus further comprises means for locating said indexing apertures relative to said reservoir means and said unload opening.

4. An automated apparatus for supplying electronic components to a processing station, said apparatus comprising:

cartridge means for supporting plural, generally in-line and generally vertical columns of said components;

plural cartridge means stations and unload stations and reservoir means respectively arranged side-by-side;

indexing and locating means for indexing said columns generally horizontally and locating each of said columns sequentially at a column unload station, said column located at said unload station being an unload column;

said indexing and locating means comprising carriage means transferable between each of said catridge means stations for selective indexing of said columns, according to said controller means;

reservoir means for receiving components from said unload column and providing a reservoir of a sufficient number of said components for said processing station such that a continuous processing of said components at said processing station is attainable during a replacement of said columns; and controller means for controlling said indexing.

5. An apparatus as in claim 4, and further comprising:
pusher means located at each of said cartridge means stations for selective actuation by said carriage means and indexing of said columns.

6. An apparatus as in claim 5, wherein said pusher means comprises:
a housing;
a pusher rod slideable between extended and retracted positions relative to said housing and biased to said retracted position, said pusher rod comprising a pivotal arm at one end thereof, said arm engageable with said cartridge means when in said extended position and not engageable with said cartridge means when in said retracted position, such that actuation of said pusher rod by said carriage means provides said column indexing.

7. An apparatus as in claim 6, wherein said pusher rod further comprises:
means for adjusting an extent of said extended position.

8. An apparatus as in claim 5, and further comprising:
carriage transport and actuation means for selectively transporting said carriage means to a particular cartridge means station and actuating said pusher means, according to said controller means.

9. An apparatus as in claim 8, and further comprising:
sensor means for sensing a need for additional components in said reservoir means and notifying said controller means such that indexing of a particular cartridge means is accomplished.

* * * * *